United States Patent [19]
Fink et al.

[11] 4,129,831
[45] Dec. 12, 1978

[54] CIRCUIT ARRANGEMENT FOR DETERMINING AND ANALYZING THE PHASE INTERFERENCE-MODULATION OF A MEASURING SIGNAL

[75] Inventors: Helmuth Fink, Munich; Guenter Wess, Seefeld, both of Germany

[73] Assignee: Siemens Aktiengesellschaft, Berlin & Munich, Germany

[21] Appl. No.: 821,838

[22] Filed: Aug. 4, 1977

[30] Foreign Application Priority Data

Sep. 30, 1976 [DE] Fed. Rep. of Germany ....... 2644159

[51] Int. Cl.² .............................................. G01R 27/00
[52] U.S. Cl. ................................................. 324/57 H
[58] Field of Search ............................ 324/57 H, 57 R

[56] References Cited
U.S. PATENT DOCUMENTS

| 3,384,818 | 5/1968 | Longerich et al. | 324/57 H |
| 3,414,809 | 12/1968 | Hoffmann et al. | 324/57 H |
| 3,737,766 | 6/1973 | Lubarsky, Jr. | 324/57 R |
| 3,818,331 | 6/1974 | Schlosser | 324/57 R |
| 3,818,332 | 6/1974 | Schlosser | 324/57 R |

Primary Examiner—Stanley T. Krawczewicz
Attorney, Agent, or Firm—Hill, Gross, Simpson, Van Santen, Steadman, Chiara & Simpson

[57] ABSTRACT

A circuit arrangement for measuring the phase modulation disturbance of a test signal which is passed through a test object and wherein a heterodyne oscillator supplies an input to a mixer which receives the input signal and supplies an output to a detector and display device and wherein the output of the mixer is applied to an automatic frequency control loop including a reference oscillator and a phase discriminator and wherein the output of the phase discriminator is supplied to a detector which supplies an input to a voltage comparator that also receives a reference voltage and which produces an output signal during the overshooting of the reference voltage by the output voltage of the phase discriminator and wherein a pulse counter which counts the occurrence of such overshoots is provided.

7 Claims, 2 Drawing Figures

CIRCUIT ARRANGEMENT FOR DETERMINING AND ANALYZING THE PHASE INTERFERENCE-MODULATION OF A MEASURING SIGNAL

CROSS-REFERENCES TO RELATED APPLICATIONS

This application is an improvement on co-pending application Ser. No. 665,500, entitled "Circuit Arrangement For Measuring The Phase Modulation Distrubance of a Test Signal", filed Mar. 10, 1976 by Helmuth Fink and Guenter Wess.

BACKGROUND OF THE INVENTION

1. Field of the Invention

This invention relates in general to test circuits for determining the phase modulation distrubances of a measuring signal which passes through a test object.

2. Description of the Prior Art

Phase variation has previously been measured at measuring points which lie in range of the carrier frequency operated portions or stages of a carrier frequency transmission system and the signal being measured is picked up and converted with a carrier frequency heterodyne receiver of a level measuring apparatus and is converted into the original frequency position and fed in at the low frequency input and then is evaluated by means of measuring apparatus operating in the low frequency range. Such prior art systems require expensive apparatus and numerous operating stages and settings of the interconnected devices which make the measurement time lengthy and very expensive.

SUMMARY OF THE INVENTION

The present invention relates to an improvement of co-pending application Ser. No. 655,500 now U.S. Pat. No. 4,050,014 and has an object to analyze the predetermined phase interference modulation in a manner such that the phase jitter properties can be accurately measured.

The object is the invention is accomplished in that the analyzing device contains a voltage comparator which is connected to a reference voltage and which emits an output signal whenever the reference voltage is being overshot by the input voltage of the phase decriminator and further provides a pulse counter which counts the number of times such overshoot occurs.

An advantage of the present invention is that the value of the reference voltage and the number of individual overshoots correspond to a specific reference voltage and which occur in a predetermined counting time provides an accurate and objective statement that can be easily compared both relative to the quality and quantity regarding the phase jitter properties of an object to be measured. If a communication transmission system or component thereof is being analyzed, the present invention provides a fundamental item of information regarding its susceptibility to interference during the transmission of digital signals.

Other objects, features and advantages of the invention will be readily apparent from the following description of certain preferred embodiments thereof taken in conjunction with the accompanying drawings although variations and modifications may be effected without departing from the spirit and scope of the novel concepts of the disclosure and in which:

DESCRIPTION OF THE PREFERRED EMBODIMENTS

Figure 1:
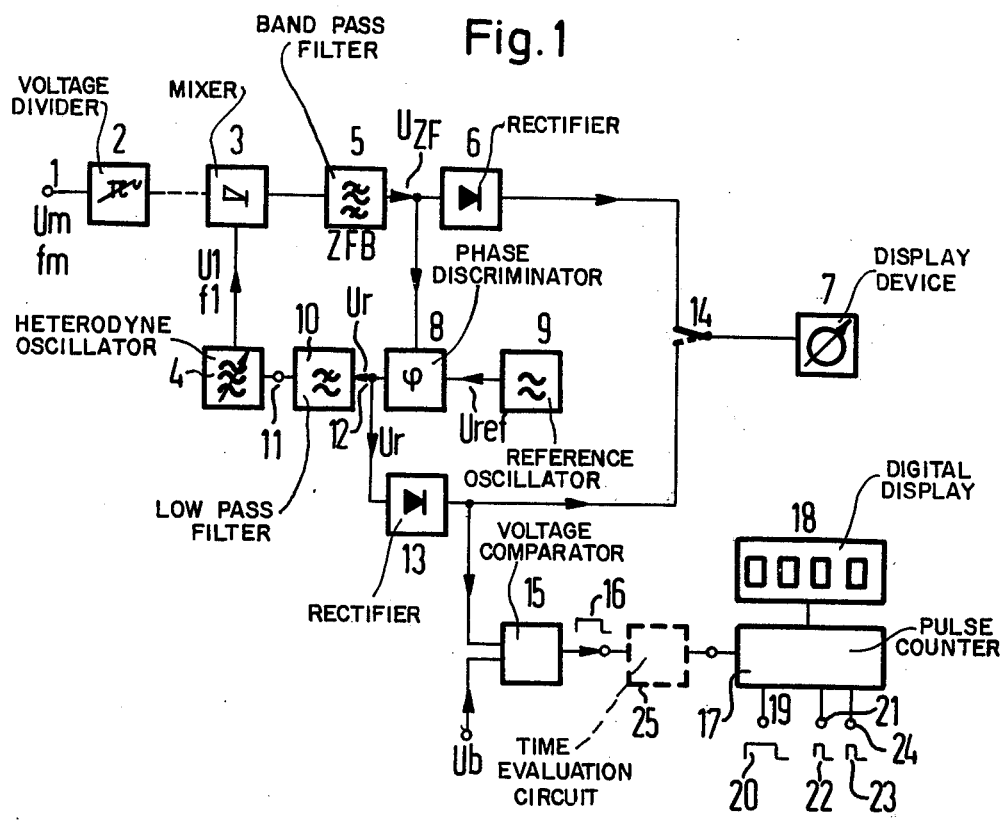
FIG. 1 is a block diagram of an exemplary embodiment of the invention.

In FIG. 1, an input terminal 1 of a carrier frequency heterodyne receiver is connected to a circuit point operated at a carrier frequency and receiving an output of a carrier frequency transmission system. The measuring signal Um which is tapped from the circuit point which has the frequency of fm in the carrier frequency range or a part thereof which has been obtained through the adjustable voltage divider 2 is supplied to a mixer 3 in which it is mixed with a voltage U1 having a frequency f1 from a heterodyne oscillator 4. A band pass filter 5 having a pass band of ZFB receives the output of the mixer 3 and filters out certain mixed products and passes intermediate frequency signal $U_{ZF}$ and supplies it to a rectifier 6. A change-over switch 14 has its movable contact shown in FIG. 1 connected to the output of the rectifier to supply the output of the rectifier to a display or analysis device 7 in which the amplitude of the measuring signal Um and/or the phase of the signal is analyzed, for example, with a level measurement in which case the represented circuit is also referred to as a selective carrier-frequency level meter.

So as to keep the receive automatically tuned once it has been tuned to fm inspite of slight fluctuations in fm, the measuring signal $U_{ZF}$ which has been converted into the intermediate frequency band ZFB is fed to the first input of a phase discriminator 8 which receives at its second input a reference voltage Uref from a reference oscillator 9. The frequency Uref corresponds to the theoretical value of the frequency $U_{ZF}$ and exhibits a constant phase which serves as the reference phase. Depending upon the phase difference between the voltages $U_{ZF}$ and Uref, the discriminator 8 produces a regulating voltage Ur which is passed to a low pass filter 10 and filtered and then fed to the frequency control input 11 of the heterodyne oscillator 4 to control its frequency. The signal Ur regulates the frequency f1 of the heterodyne oscillator 4 in a manner such that the frequency of $U_{ZF}$ remains constantly at its theoretical value and, thus, always lies in the center of the pass band of the pass band filter 5.

The output voltage Ur of the phase discriminator 8 is also tapped at a tapping point 12 and serves as a measure for the phase interference modulation of the measuring signal Um which this signal has experienced when passing through the test object which is being measured. It is necessary to provide prior to analysis, that the voltage Ur be rectified in a rectifier 13 after which it can be evaluated either in terms of peak value, effective value or mean value. For this purpose, the change-over switch 14 has its movable contact moved from the output of the rectifier 6 to the output of the rectifier 13 so that the rectified output of the rectifier 13 which comprises the rectified voltage Ur is supplied to the display and analysis device 7 the phase interference modulation is display.

Also, the voltage Ur possibly after having been rectified, is supplied to the first input of a voltage comparator 15 which has a second input to which a reference voltage Ub is supplied. The voltage comparator 15 emits an output signal 16 when the reference voltage Ub is exceeded by the voltage Ur. A pulse counter 17 is connected to the output of the voltage comparator 15 and receives the output signal 16 and counts the rising flanks of the occuring output signal 16. The output of the pulse counter is displayed in a digital display device 18. Preferably, the number of output signals 16 occuring within a given counting time are counted which is accomplished by actuating the pulse counter 17 only for the duration of a check pulse 20 which is supplied to the control input terminal 19 of the pulse counter 17. At the end of the counting time, a pulse 22 is applied to a second control input terminal 21 of the counter 17 to cause the counting results to be transferred into the display device 18 and prior to the beginning of each counting process the counter is reset to zero by a reset pulse 23 applied to an additional control input terminal 24 of the counter 17.

According to a preferred further development of the invention, the pulse counter 17 can receive the output of a time evaluation circuit 25 which receives the output of the voltage comparator 15 as shown in dotted line in FIG. 1. The time evaluation circuit 25 transfers output signal 16 to the pulse counter 17 only when such signal 16 have a length which exceeds a specific preset time.

Figure 2:
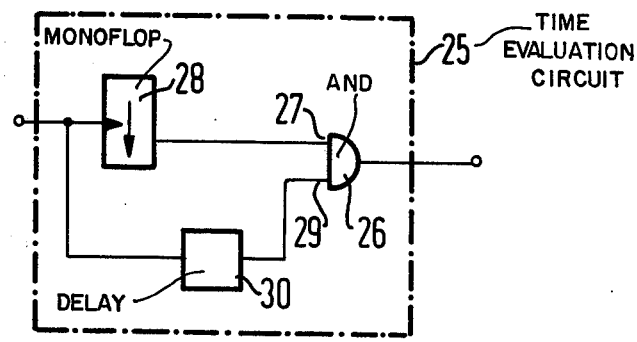
FIG. 2 illustrates the time evaluation circuit in detail.

FIG. 2 illustrates a specific time evaluation circuit 25 of this type and comprises an AND gate 26 which receives a first input 27 comprising a blocking signal from the output 27 of a monoflop circuit 28 which is triggered by the leading flanks of the output signals 16 during the time when the output signal 16 exists. The AND gate 26 receives a second input 29 which comprises the output signal 16. Thus, this circuit assures that only those output signal 16 which exceed the inherent preset time of the monoflop circuit 28 are supplied to the input of the pulse counter 17. In order to prevent the front flanks of the output signal 16 passing the AND gate in the event of a delayed emisssion of the blocking signal to the input 27 the input 29 of the AND gate 26 can be preceeded by delay circuit 30.

Although the invention has been described with respect to preferred embodiments, it is not to be so limited as changes and modifications may be made therein which are within the full intended scope of the invention as defined by the appended claims.

We claim as our invention:

1. Circuit arrangement for determining the phase interference modulation of a measuring signal which is obtained via an object to be measured in the carrier-frequency band, employing a selective carrier-frequency heterodyne receiver, wherein the output voltage of a phase discriminator arranged in an automatic fine tuning circuit of the carrier-frequency heterodyne receiver and producing a voltage which regulates the frequency of a heterodyne oscillator depending upon the phase difference between the measuring signal which has been converted into an intermediate frequency band and a reference voltage obtained from a reference oscillator, the output of said phase discriminator serving as a measurement for the phase interference modulation which is applied to an evaluation device, comprising the improvement in the combination wherein said evaluation device contains a voltage comparator (15) which is connected to a source delivering a reference voltage (Ub), and emits an output signal (16) during the time the reference voltage (Ub) is exceeded by the output voltage (Ur) of the phase discriminator (8), and a pulse counter (17) connected to said voltage comparator (15) which counts the occurrrences of the output signals (16).

2. A circuit arrangement as claimed in claim 1, wherein said pulse counter (17) is designed so that it is actuated for a predetermined counting time.

3. A circuit arrangement as claimed in claim 2, characterized in that the pulse counter (17) is preceded by a time evaluation circuit (25) which transfers to the pulse counter (17) only those output signals whose length in time exceeds a predetermined time.

4. A circuit arrangement as claimed in claim 3, characterized in that said time evaluation circuit (25) consists of an AND gate (26), a monoflop circuit (28) which is triggered by the front flanks of the output signals (16) of the voltage comparator (15) and said monoflop circuit (28) supplying a first input (27) to said AND gate during the predetermined time of said monoflop circuit and the second input (29) of said AND gate supplied with said output signals (16).

5. A circuit for detecting phase modulation disturbances of a signal, which has passed through a test object, in the carrier-frequency band comprising a carrier-frequency selective heterodyne receiver comprising a mixer receiving the incoming signal after it has passed through said test object, a band pass filter receiving the output of said mixer and passing an I.F. frequency, a voltage tunable heterodyne oscillator supplying an input to said mixer, a reference oscillator, a phase discriminator receiving a portion of said I.F. frequency and the output of said reference oscillator and producing an output voltage which is supplied to said voltage tunable heterodyne oscillator to adjust the frequency of said heterodyne oscillator, a first detector receiving a portion of the I.F. output of said band pass filter, an evaluation device receiving the output of said first detector, a second detector connectible to the output of said phase discriminator, switching means connected to said second detector and said switching means disconnecting the output of said first detector from said evaluation device and connecting said second detector to said evaluation device, comprising the improvement of a voltage comparator connected to the output of said second detector, a source delivering a reference voltage connected to said voltage comparator and said voltage comparator producing an output signal when the output of said second detector exceeds said reference voltage, and a counter for counting the output signal from said voltage comparator.

6. Apparatus according to claim 5 wherein said counter receives a periodic reset signal such that it counts the number of output signal pulses occurring during a predetermined time.

7. Apparatus according to claim 6 including a time evaluation circuit connected between said counter and said voltage comparator.

* * * * *